US011861167B2

(12) United States Patent
Chen et al.

(10) Patent No.: US 11,861,167 B2
(45) Date of Patent: Jan. 2, 2024

(54) MAINTENANCE OPERATIONS FOR MEMORY DEVICES

(71) Applicant: Micron Technology, Inc., Boise, ID (US)

(72) Inventors: Ning Chen, San Jose, CA (US); Jiangli Zhu, San Jose, CA (US); Fangfang Zhu, San Jose, CA (US); Ying Yu Tai, Mountain View, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/859,816

(22) Filed: Jul. 7, 2022

(65) Prior Publication Data
US 2022/0404969 A1    Dec. 22, 2022

Related U.S. Application Data

(63) Continuation of application No. 16/913,753, filed on Jun. 26, 2020, now Pat. No. 11,392,292.

(60) Provisional application No. 62/874,451, filed on Jul. 15, 2019.

(51) Int. Cl.
*G06F 3/06* (2006.01)

(52) U.S. Cl.
CPC .......... *G06F 3/0604* (2013.01); *G06F 3/0655* (2013.01); *G06F 3/0679* (2013.01)

(58) Field of Classification Search
CPC ..... G06F 3/0604; G06F 3/0655; G06F 3/0679
See application file for complete search history.

(56) References Cited

U.S. PATENT DOCUMENTS

| 9,785,550 | B1* | 10/2017 | Kim ..................... G06F 12/0246 |
| 2014/0173180 | A1 | 6/2014 | D'Abreu et al. |
| 2017/0329542 | A1 | 11/2017 | Chou et al. |
| 2018/0276135 | A1 | 9/2018 | Oikawa |
| 2018/0366204 | A1 | 12/2018 | Wu et al. |
| 2019/0042150 | A1* | 2/2019 | Wells ..................... G06F 3/0659 |
| 2019/0324689 | A1 | 10/2019 | Choi et al. |
| 2019/0354311 | A1* | 11/2019 | Ji ......................... G06F 9/30101 |
| 2020/0073571 | A1* | 3/2020 | Chen ....................... G06N 5/04 |
| 2020/0110544 | A1 | 4/2020 | Zhu et al. |
| 2022/0291854 | A1* | 9/2022 | Wilson .................. G06F 3/0647 |

OTHER PUBLICATIONS

Plosila et al, Synchronous Design Aspects Using Action Systems, Oct. 5, 1998, University of Turku, Department of Applied Physics (Year: 1998).

* cited by examiner

*Primary Examiner* — Ryan Bertram
(74) *Attorney, Agent, or Firm* — Holland & Hart LLP

(57) ABSTRACT

Methods, systems, and devices for performing an access operation on a memory cell, incrementing a value of a first counter based on performing the access operation on the memory cell, determining that the incremented value of the first counter satisfies a threshold, incrementing a value of a second counter based on determining that the incremented value of the first counter satisfies the threshold, and performing a maintenance operation on the memory cell based on determining that the incremented value of the first counter satisfies the threshold are described.

14 Claims, 9 Drawing Sheets

MAINTENANCE OPERATIONS FOR MEMORY DEVICES

CROSS REFERENCE

The present Application for Patent is a continuation of U.S. patent application Ser. No. 16/913,753 by CHEN et al., entitled "MAINTENANCE OPERATIONS FOR MEMORY DEVICES," filed Jun. 26, 2020, which claims the benefit of U.S. Provisional Patent Application No. 62/874,451 by CHEN et al., entitled "MAINTENANCE OPERATIONS FOR MEMORY DEVICES," filed Jul. 15, 2019, each of which is assigned to the assignee hereof, and each of which is expressly incorporated by reference herein.

TECHNICAL FIELD

The following relates generally to a memory sub-system and more specifically to maintenance operations for memory sub-systems.

BACKGROUND

A memory sub-system can be a storage device, a memory module, and a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

Access operations can be performed on memory devices. The access operations can, over time, reduce the effectiveness of the memory cells within the memory device. In some cases, wear of some memory cells can be different than other memory cells within the memory device. Uneven wear of the individual memory cells can lead to a shortened device life due to some memory cells wearing at a faster rate compared with other memory cells within the memory device.

DETAILED DESCRIPTION

Figure 1:
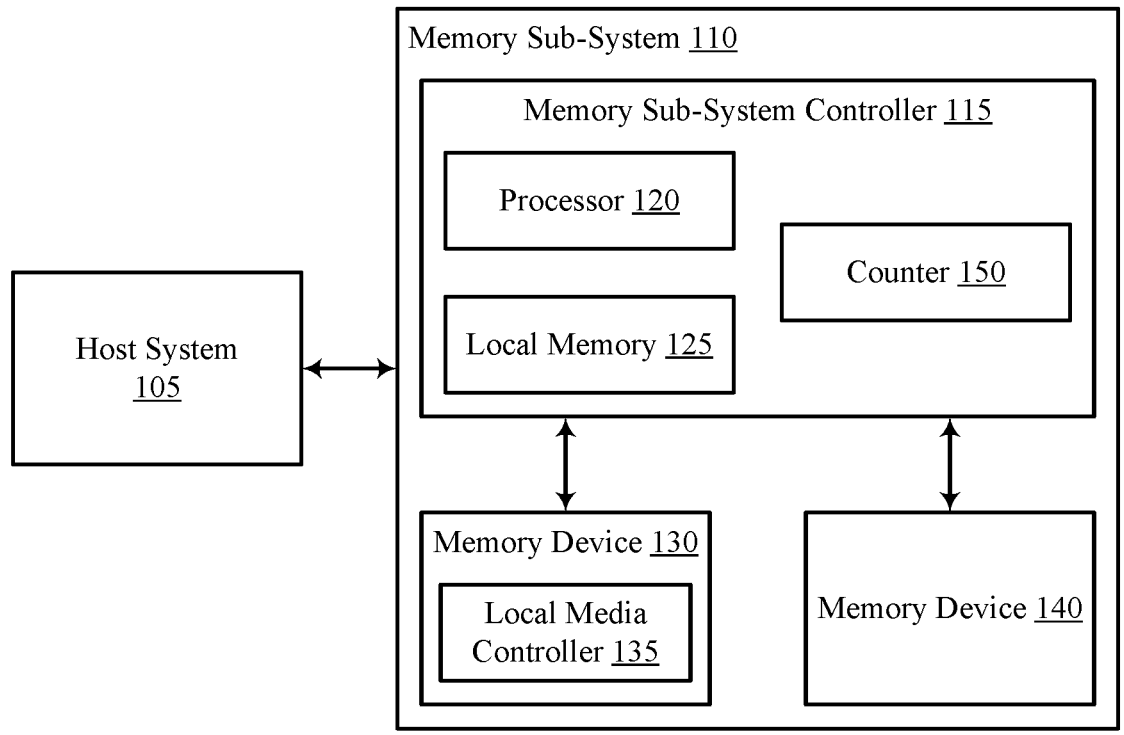
FIG. 1 illustrates an example of a computing environment in accordance with examples as disclosed herein.

Aspects of the present disclosure are directed to maintenance operations for memory systems. A memory sub-system can be a storage device, a memory module, or a hybrid of a storage device and memory module. Examples of storage devices and memory modules are described with reference to FIG. 1. In general, a host system can utilize a memory sub-system that includes one or more memory components. The host system can provide data to be stored at the memory sub-system and can request data to be retrieved from the memory sub-system.

The memory components can include non-volatile and volatile memory devices. A non-volatile memory device is a package of one or more dice. The dice in the packages can be assigned to one or more channels for communicating with a memory sub-system controller. The non-volatile memory devices include cells (i.e., electronic circuits that store information), that are grouped into pages to store bits of data.

The non-volatile memory devices can include three-dimensional cross-point ("3D cross-point") memory devices that are a cross-point array of non-volatile memory that can perform bit storage based on a change of bulk resistance, in conjunction with a stackable cross-gridded data access array. Although non-volatile memory components such as 3D cross-point type memory are described, the memory device can be based on any other type of non-volatile memory, such as negative-and (NAND), and other examples as described below in conjunction with FIG. 1.

Access operations can be performed by a memory sub-system on memory devices and can include read operations, erase operations, write operations, re-write operations. Access operations can cause wear in the memory cell. In some cases, wear of some memory cells can be different than other memory cells within the memory device. Unevenness in the wearing of the memory cells can be due to some memory cells being accessed more frequently compared with other memory cells. In this example, the more frequently accessed memory cells within the memory device can have a lower read/write life. As such, the overall life of the memory device can be affected negatively by the more frequently accessed memory cells.

Aspects of the present disclosure address the above and other deficiencies by having a memory sub-system that includes a counter configured to count the number of access operations. The memory sub-system can coordinate the number of access operations on specific sets of memory cells, thereby mitigating the decreased life of the memory device. For example, counting the number of access operations that sets of memory cells undergo, and when a threshold number (e.g., a number limit) of access operations are performed, changing subsequent access operations to memory cells in a different set. Additionally, in some cases, maintenance operations, such as wear leveling operations, can be initiated on the memory cells of the set that has reached the threshold. In some examples, the threshold number can be changeable to accommodate different numbers of access operations, which can be based upon the age of the memory device. The maintenance operations can level the wear throughout the memory device and increase the life of the memory device.

In some cases, the counters can be implemented using a global counter, an offset counter, and a set-specific counter. Some non-volatile memory devices, such as 3D cross-point memory devices, can group pages across dice and channels to form management units (MUs). An MU can include user data and corresponding metadata. A memory sub-system controller can send and receive user data and corresponding metadata as management units to and from memory devices. A super management unit (SMU) may be a group of one or more MUs that are managed together. For example, a memory sub-system controller can perform media management operations (e.g., wear level operations, refresh operations, etc.) on SMUs. Other types of non-volatile memory devices can be comprised of one or more planes. Planes can be groups into logic units (LUN). For some types of non-volatile memory devices (e.g., NAND devices), each plane may include of a set of physical blocks, which may be the smallest area than can be erased. A set-specific counter can be a MU-specific counter, an SMU-specific counter, or a block-specific counter.

A memory sub-system can be configured to use a value of the global counter, a value of the offset counter, and a value of the set-specific counter to determine a count of access operations performed on each set of memory cells. A set of memory cells can be an MU, an SMU, or memory bank. The counting system can be configured to allow a global least-significant value to be updated without having to update each of the set-specific counters.

Features of the disclosure are initially described in the context of a computing environment as described with reference to FIG. 1. Features of the disclosure are described in the context systems and timing diagrams as described with reference to FIGS. 2, 3, and 4. These and other features of the disclosure are further illustrated by and described with reference to an apparatus diagram, a computer diagram, and flowcharts that relate to maintenance operations for memory systems as described with references to FIGS. 5-10.

FIG. 1 illustrates an example of computing environment 100 in accordance with examples as disclosed herein. The computing environment can include a host system 105 and a memory sub-system 110. The memory sub-system 110 can include media, such as one or more non-volatile memory devices (e.g., memory device 130), one or more volatile memory devices (e.g., memory device 140), or a combination thereof.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 105 that is coupled with a memory system. The memory system can be one or more memory sub-systems 110. In some examples, the host system 105 is coupled with different types of memory system 110. FIG. 1 illustrates one example of a host system 105 coupled with one memory sub-system 110. The host system 105 uses the memory sub-system 110, for example, to write data to the memory sub-system 110 and read data from the memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 105 can be a computing device such as a desktop computer, laptop computer, network server, mobile device, a vehicle (e.g., airplane, drone, train, automobile, or other conveyance), embedded systems, Internet of Things (IoT) devices, or such computing device that includes a memory and a processing device. The host system 105 can be coupled to the memory sub-system 110 using a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 105 and the memory sub-system 110. The host system 105 can further utilize an NVM Express (NVMe) interface to access the memory components (e.g., memory devices 130) when the memory sub-system 110 is coupled with the host system 105 by the PCIe interface. The physical host interface can provide an interface for passing control, address, data, and other signals between the memory sub-system 110 and the host system 105.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

An example of non-volatile memory devices (e.g., memory device 130) includes a three-dimensional (3D) cross-point ("3D cross-point") type flash memory, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory components such as 3D cross-point type memory are described, the memory device 130 can be based on any other type of non-volatile memory, such as negative-and (NAND), read-only memory (ROM), phase change memory (PCM), self-selecting memory, other chalcogenide based memories, ferroelectric random access memory (FeRAM), magneto random access memory (MRAM), negative-or (NOR) flash memory, and electrically erasable programmable read-only memory (EEPROM).

In some embodiments, each of the memory devices 130 can include one or more arrays of memory cells such as single level cells (SLCs), multi-level cells (MLCs), triple level cells (TLCs), quad-level cells (QLCs), or a combination of such. In some examples, a particular memory component can include an SLC portion, and an MLC portion, a TLC portion, or a QLC portion of memory cells. Each of the memory cells can store one or more bits of data used by the host system 105. Furthermore, the memory cells of the memory devices 130 can be grouped as memory pages or a set of memory cells that can refer to a unit of the memory component used to store data. Pages can be grouped across dice and channels to form management units (MUs). An MU can include user data and corresponding metadata. A super management unit (SMU) is a group of one or more MUs that are managed together.

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 120 (e.g., a processing device) configured to execute instructions stored in a local memory 125. In the illustrated example, the local memory 125 of the memory sub-system controller 115 includes an embedded memory configured to store instructions for performing various processes, operations, logic flows, and routines that control operation of the memory sub-system 110, including handling communications between the memory sub-system 110 and the host system 105.

In some examples, the local memory 125 can include memory registers storing memory pointers, fetched data, etc. The local memory 125 can also include read-only memory (ROM) for storing micro-code. While the example memory sub-system 110 in FIG. 1 has been illustrated as including the memory sub-system controller 115, in another example of the present disclosure, a memory sub-system 110 cannot include a memory sub-system controller 115, and can instead rely upon external control (e.g., provided by an external host, or by a processor or controller separate from the memory sub-system).

In general, the memory sub-system controller 115 can receive commands or operations from the host system 105 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA)) and a physical address that are associated with the memory devices 130. The memory sub-system controller 115 can further include host interface circuitry to communicate with the host system 105 via the physical host interface. The host interface circuitry can convert the commands received from the host system into command instructions to access the memory devices 130 as well as convert responses associated with the memory devices 130 into information for the host system 105.

The memory sub-system 110 can also include additional circuitry or components that are not illustrated. In some examples, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the media device 130 (e.g., perform media management operations on the media device 130). In some embodiments, the memory devices 130 can be locally managed memory devices, which is a raw memory device combined with a local media controller 135 that performs memory management operations on the memory device 130 within the same memory device package.

The memory sub-system 110 includes a counter 150 that can count the number of access operations performed on sets of memory cells of a memory device and initiate maintenance operations on the memory cells, which can be based upon a threshold number of access operations that may be modifiable. Coordinating (e.g., counting) the number of access operations on specific sets of memory cells can mitigate the decreased life of the memory sub-system 110. For example, counting the number of access operations that sets of memory cells undergo can allow for wear leveling operations to be performed on certain sets of memory cells (e.g., sets of memory cells that have reached a threshold number of access operations). Such wear leveling operations can increase the life of the memory sub-system 110.

In some cases, counter 150 may count any number of access operations performed on the memory cells until the threshold number of access operations is reached. Counter 150 can also count any number of maintenance operations performed on the memory cells. The number of times that maintenance operations have been performed on the memory cells may be based on the amount of times the counter 150 has counted the number of access operations from 0 to the threshold number of access operations. In some examples, the memory sub-system controller 115 includes at least a portion of the counter 150. For example, the memory sub-system controller 115 can include a processor 120 (e.g., a processing device) configured to execute instructions stored in local memory 125 for performing the operations described herein. In some examples, the counter 150 is part of the host system 105, an application, or an operating system.

The counter 150 can count the number of access operations performed on the memory cells and can initiate wear leveling operations based upon a criterion (e.g., threshold value of access operations). Counting the number of access operations can be accomplished by multiple parts of counter 150. In some embodiments, the counter includes two parts. The first part of the counter 150 can count the number of access operations until a criterion (e.g., threshold value) is satisfied. The first part can restart the count once the threshold has been satisfied. The second part of the counter 150 can increment once the first part satisfies the threshold. The second part can then initiate switching access operations to a different part of the memory device (e.g., different cells), and/or trigger maintenance operations (e.g., wear leveling operations) on the memory cells. The second part of the counter 150 can store the number of times the criterion (e.g., threshold value) has been satisfied. In some examples, the threshold is configurable, user/system defined, and/or can be changed. Further details with regards to the operations of the counter 150 are described below.

Figure 2:
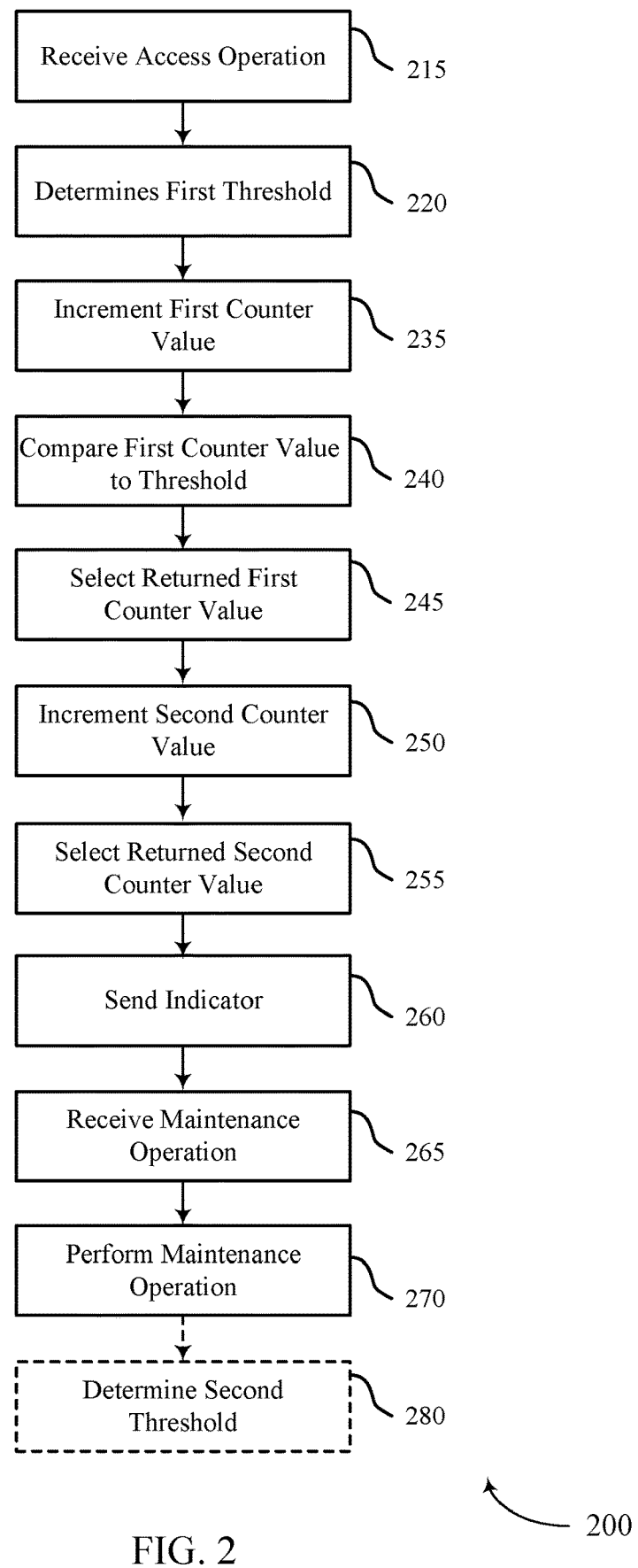
FIG. 2 illustrates an example of a method that supports maintenance operations for memory systems in accordance with examples as disclosed herein.

FIG. 2 illustrates an example of a method 200 for determining wear leveling operation coordination in a memory sub-system, according to an embodiment of the present disclosure. The method 200 can be performed by a memory sub-system, which can be an example of a memory sub-system 110 described with reference to FIG. 1.

The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 may be performed by counter 150 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other methods are possible.

The memory sub-system can receive access commands from the host system. Such access commands can be read commands, write commands, or erase commands which can read, erase, write, and/or re-write data to specific memory cells in memory devices of the memory sub-system. In some cases, accessing, erasing, or writing data in the memory cells can cause the memory cells to wear, which can limit the life of the memory cells within the memory sub-system. In some cases, if the wear of the memory sub-system is left unchecked, the life of the memory sub-system can be decreased.

To reduce the impact of wear caused by access operations on the memory cells in the memory sub-system, maintenance operations can be used. Maintenance operations can be a variety of operations to lessen wear on the memory sub-system, including wear leveling operations. In some examples, wear leveling can limit the impact of wear caused by erasing, writing, and rewriting data to the memory cells in the memory sub-system. Wear leveling can be a process that helps reduce premature wear in memory devices by distributing write operations across the memory devices. Wear leveling can include a set of operations to determine which physical media (e.g., set of memory cells) to use. Each time data is programmed to help ensure that certain physical sets of memory cells are not written and erased more often than others. Wear leveling can allow for the wear of a specific memory cell to be similar to the wear experienced by the other memory cells within the memory sub-system (e.g., the wear across different cells can be leveled). In some examples, even distribution of the access operations across the different cells of the memory sub-system can ensure that specific memory cells are not erased and re-written more often than other memory cells. In some cases, wear leveling operations can be performed after a set number of access operations performed on the memory cells. Thus, the wear experienced in the accessed memory cells of the memory sub-system can be evenly distributed across the different sets of memory cells within the memory sub-system. Even distribution of the wear experienced by the memory cells can extend the life of the memory sub-system.

A host system can send access requests to the memory sub-system, such as to store data at the memory sub-system and to read data from the memory sub-system. The data to be read and written are hereinafter referred to as "user data". A host request can include a logical address (e.g., logical block address (LBA)) for the user data, which is the location the host system associates with the user data. The logical address (e.g., LBA) can be part of metadata for the user data. The requests can be in the form of access operation commands (e.g., read command, write command).

For example, at operation 215, the memory sub-system can receive access operation commands, for example, from a host system. The access operation commands can initiate access operations on memory cells within a specific set of the memory sub-system. The access operations can include read operations, erase operations, write operations, re-write operations, other operations, or combinations thereof, which can cause wear in the memory cell. The memory sub-system can continuously receive successive access operations for the same memory cells within the same set of cells on the memory sub-system, which can cause additional wear. In some cases, successive access operations on the memory cells within the set can occur before the memory sub-system has performed access operations on memory cells within other sets of the memory sub-system. Additionally or alternatively, the access operations can be performed without periodic wear leveling operations on the accessed memory cells. This can lead to the premature wear of the accessed memory cells compared to non-accessed memory cells in other sets of the memory sub-system.

Wear leveling operations can be performed on memory cells within a set of the memory sub-system, which can be after a specific number of access operations have been performed on the memory cells. Counting the number of access operations performed on the individual memory cells within the set can allow for the memory sub-system to coordinate the wear leveling operations performed on the different sets of memory cells. To reduce wear on specific memory cells in the set, counting the number of access operations performed on the memory cells can be used. Additionally, the memory sub-system can determine a threshold number of access operations performed on the memory cells before performing wear leveling operations on the previously accessed cells. Counting the number of access operations performed on the memory cells can prevent a higher wear rate on the accessed memory cells compared to other less-accessed cells in the memory sub-system. Therefore, the memory sub-system can cease access operations, and in some examples, initiate wear leveling operations, on the accessed cells within the memory sub-system after a certain count of access operations have occurred.

The memory sub-system can identify the limit on the number of access operations performed on the memory cells within the specific set. The number of access operations (e.g., counts/values) that the set of the memory sub-system can undergo before wear leveling operations occur can be a fixed number. In some examples, this number can be regarded as a threshold. The threshold of access operations that a set can undergo can occur before initiating wear leveling operations can be in the hundreds, thousands, tens of thousands, or hundreds of thousands of access operations. The threshold can be stored in a register of the memory sub-system. In some cases, the value of the threshold can be configurable such that the memory sub-system can be configured to modify the threshold. In some embodiments, the memory sub-system receives one or more threshold values from the host system and can store the value in a register of memory sub-system.

For example, at operation 220, the memory sub-systems determine a first threshold, for example, by accessing the threshold value in a register. The memory sub-system can use the first threshold value as the number of access operations to occur upon the memory cells within the set before switching access operations to a new set and initiating wear leveling operations. In some cases, the threshold value can be changed, which can accommodate different values to reduce or increase the number of access operations performed on the memory cells within the set. For example, when the memory sub-system is new (e.g., low in the number of access operations performed on the memory cells) the threshold value can be high. However, as the memory sub-system ages (e.g., the memory cells undergo more access operations), the threshold value can be reduced to allow for more frequent wear leveling operations to take place in the memory sub-system. The reduction in the threshold can prolong the life of the memory sub-system. However, in some examples, the threshold can be the same throughout the life of the memory sub-system. In other examples, the threshold can be increased. Therefore, in some examples, the memory sub-system determines a second threshold, which can be different from the first threshold, at any time. The second threshold value can be stored in a register. The second threshold can replace the first threshold and can be used for the subsequent wear leveling coordination operations (e.g., operations 235-255). In some cases, the first threshold value can be used in all wear leveling operations without using any other (e.g., second) threshold values.

The memory sub-system can identify the count of the number of access operations performed on the memory cells within the sets of memory sub-system. In some examples, the counts can be checked for the number's divisibility by the threshold to determine if the count has met the threshold (which can initiate wear leveling operations). In some cases, this can be accomplished by a divider circuit. The divider circuit can utilize a divisor corresponding to the threshold value. However, the divider circuit can be limited to certain divisors. For example, the divisor can be limited to a power of two (e.g., $2^n$). In this case, a divisor that cannot be a power of two cannot be used as a divisor by the divider circuit. Thus, the divider circuit can be inflexible regarding the thresholds that can be used. Additionally, the divider circuit can be expensive, which can be due to the complexity of the circuitry of the divider circuit. For example, the divider circuit can use a large number of gates, thereby increasing the area of the divider circuit or the divider circuit can consume larger amounts of power. As such, a count of access operations determined by other methods can be advantageous.

The use of a divider circuit to count the number of access operations performed on memory cells within a set of the memory sub-system can be avoided by utilizing a combined counter. Combined counter 305, as described with reference to FIG. 3, can be an example such a combined counter. Each set of memory cells within the memory sub-system can include their own combined counter, which can count the number of access operations performed on the memory cells within that set. For example, the combined counter can identify (e.g., determine) the count of the number of access operations performed on the memory cells within the set.

The combined counter can have a first counter and a second counter. The first counter can be an example of the first counter 315 and the second counter can be an example of the second counter 345 described in more detail with reference to FIG. 3. The first counter can count the number of access operations performed on the memory cells in the set. The first counter can count the number of access operations from zero to a defined number (e.g., the threshold of access operations) and determine if the threshold of access operations has been reached. For example, a comparator can be used to compare the count of access operations performed on the memory cells within the set to the threshold. Comparator 330, as described with reference to FIG. 3, can be an example of such a comparator. At operation 235, the first counter can increment the count by an integer (e.g., 1) and communicate the incremented value to the comparator. At operation 240, the comparator can compare the incremented value to the threshold value. In some examples, at operation 240, the comparator can determine that the incremented count has not yet satisfied (e.g., is less than) the threshold. In this example, at operation 245, the first counter can receive a returned incremented count value, which can be selected based upon the incremented count not satisfying (e.g., being less than) the threshold. However, in some cases, at operation 240, the comparator can determine that the incremented value satisfies (e.g., matches or exceeds) the threshold. In this case, at operation 245, the first counter can be reset to a zero value. The zero value can then be incremented, which can be based upon the subsequent access operations performed on the memory cells in the set. The first counter can then iteratively perform incrementations of the count until the threshold value is reached again.

The second counter of the combined counter can trigger wear leveling operations on the set and additionally or alternatively count the number of wear leveling operations performed on the set. The wear leveling operation count can begin at 0, which can indicate that no previous wear leveling operations have been performed upon the memory cells in the set (e.g., the threshold has not yet been satisfied). At operation 250, the second counter can increment the value from 0 to 1. However, in some examples, when the threshold has previously been reached, the incrementation can add to a non-zero number. In the example where the comparator has determined that the incremented first counters value (e.g., the number of access operations) is less than the threshold value, at operation 255, the second counter can receive a returned selected non-incremented count (e.g., a 0). However, in the example where the comparator has determined that the first counters count value matches the threshold value, at operation 255, the second counter can receive a returned selected incremented count (e.g., a 1).

In the case where the comparator has received an incremented count, maintenance operations can be triggered, which can include wear leveling operations. Maintenance operations can be performed by the memory sub-system. The operations can be initiated by the firmware of the memory sub-system. Triggering maintenance operations can be initiated by the second counter indicating the second counters incrementation in value (e.g., indicating that the comparator has determined the first counter has reached the threshold).

To initiate the maintenance operations, at operation 260, the memory sub-system can communicate an indicator to the memory sub-system. An example of such an indication can be the specific physical address of the set where the second counter has indicated an incrementation in value (e.g., the first counter has satisfied the threshold). This can trigger the memory sub-system, at operation 265, to initiate maintenance operations, which can be wear leveling operations. Additionally or alternatively, the memory sub-system can cease access operations on memory cells within the set and move access operations to a different set of memory cells in memory sub-system. At operation 270, the memory sub-system can perform the maintenance operations on the memory cells within the set. The maintenance operation can be for a wear leveling operation, or other types of maintenance operations. The maintenance operation can prevent access operations from being performed on the memory cells within the set. The previously described process of triggering maintenance operations can iteratively be performed once access operations are performed on the memory cells, which can be after wear leveling has been completed.

As discussed previously, the memory sub-system can change the first threshold to a second threshold, which can be different from the first threshold. In some examples, the memory sub-system can change the threshold to a second threshold. The change in threshold can be based upon a variety of factors including the age of the memory sub-system, the number of access operations performed on the memory sub-system, or other considerations.

At operation 280, the memory sub-system can receive the second threshold. In some examples, the threshold can be stored in a register of the memory sub-system. In some cases the memory sub-system can receive the new threshold from the host system via a message.

Similar to operation 220, the second threshold can be used as the threshold value for the combined counter. The successive operations (e.g., 235-270) can be again performed utilizing the second threshold value. In one example, the second threshold value can be less than the first threshold value, and can be identified by the memory sub-system at a time where the number of access operations performed on the set of memory cells has previously exceeded the second threshold. In this case, the comparator can determine that the threshold has been satisfied. For example, the matching of the threshold and the access operation count cannot be used in the case where the modified second threshold is less than the current access operation count value. The comparator can determine that the access operation count is greater than the threshold, which can satisfy the threshold. In some examples, operation 280 can occur at different positions than illustrated in FIG. 2. For example, at any point during method 200, the first threshold value can be changed to a second threshold value and determined by the memory sub-system (e.g., operation 280). Therefore, a changed threshold value (whether being a second threshold value, as illustrated in FIG. 2, or a third threshold value, or any other number of subsequent threshold values) can be determined by the memory sub-system and used as the threshold value for subsequent wear leveling operation coordination steps.

Figure 3:
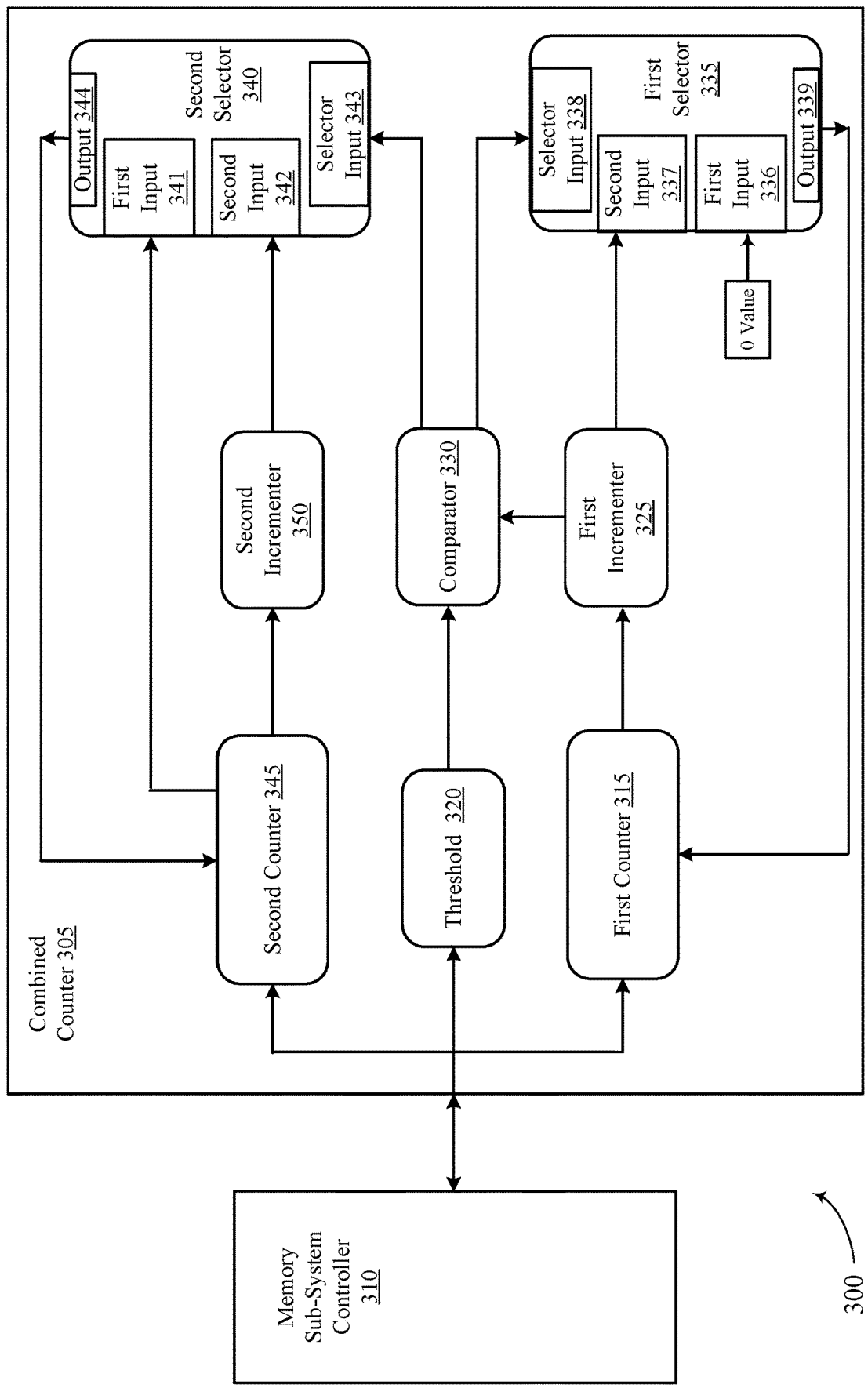
FIG. 3 illustrates an example of a counting system that supports maintenance operations for memory systems in accordance with examples as disclosed herein.

FIG. 3 illustrates an example of a counting system 300 that supports maintenance operations for memory sub-systems in accordance with examples as disclosed herein. Counting system 300 can be an example of a counting system for an individual set of memory cells within a memory sub-system. The Memory sub-system, as described with reference to FIG. 2, can be an example of such a memory sub-system. In some examples, each set of memory cells can utilize a corresponding counting system (e.g., each set of memory cells can have a corresponding combined counter 305). As such, many counting systems can be present in the memory sub-system.

Counting system 300 can include a combined counter 305 and a memory sub-system controller 310. Memory Sub-System Controller 115, described with reference to FIG. 1, can be an example of a memory sub-system controller. The memory sub-system controller 310 can receive commands (e.g., access operation commands and wear leveling operation commands) from a host system. Combined counter 305 can be coupled with memory sub-system controller 310, which can allow memory sub-system controller 310 and combined counter 305 to communicate information between memory sub-system controller 310 and combined counter 305. Examples of the communicated information can be access operation commands, wear leveling operation commands, thresholds, incrementation indications, and/or other information.

The memory sub-system containing the counting system 300 can receive access operation commands from a host system. Memory sub-system controller 310 can carry out the access operations (e.g., read, erase, write, and/or re-write data) upon the specific memory cells corresponding to the set of memory associated with the combined counter 305. In some examples, combined counter 305 can receive an access operation command from memory sub-system controller 310, which can be directed towards memory cells within the combined counter's corresponding set. Combined counter 305 can include a first counter 315 and a second counter 345. First counter 315 can count the number of access operation commands received by combined counter 305. For example, first counter 315 can receive the access operation command from memory sub-system controller 310. After receiving the access operation command, first counter 315 can output the current access operation count to first incrementer 325. First incrementer 325 can increment the value of the number of access operations by a fixed number (e.g., by 1) over the current count of access operations (e.g., incremented to a value of 2 when the number of access operations can be 1). First incrementer 325 can output the incremented access operation count to comparator 330 and first selector 335.

The memory sub-system can determine one or more thresholds. As described with reference to FIG. 2, thresholds can correspond to the number of access operations performed on the memory cells in the set before maintenance operations can be performed. Wear leveling operations are an example of such maintenance operations. When wear leveling operations are described herein, any other type of maintenance operation could additionally or alternatively be performed. Memory sub-system controller 310 can communicate a threshold to the combined counter 305. Threshold 320 can be an example of such a threshold. In some examples, threshold 320 can be a variety of threshold values. For example, threshold 320 can be 1,000, 5,000, 30,000, or other higher or lower amounts. Therefore, in some examples, threshold 320 can set the number of bits that the first counter 315 uses to count the number of access operations. For example, eleven bits can be used for counting to a corresponding threshold value of 30,000. However, in some examples, a lower threshold value (e.g., 5,000) can use fewer bits. In some examples, however, the number of bits used for the threshold value can be set by the highest threshold value (e.g., 30,000).

Memory sub-system controller 310 can communicate the threshold 320 to comparator 330. Comparator 330 can be an example of a variety of comparator circuits. Comparator 330 can use threshold 320 to compare against the incremented count of access operations received from first incrementer 325. Comparator 330 can compare the two values (e.g., threshold and the incremented count), and determine whether the incremented value matches the threshold 320. In some examples, threshold 320 can be greater than the incremented count. In this example, comparator 330 can output a low signal (e.g., a 0) to two selector components: first selector 335 and second selector 340. However, in some examples, threshold 320 can satisfy (e.g., be the same number as, or greater than) the incremented count. In this example, comparator 330 can output a high signal (e.g., a 1) to first selector 335 and second selector 340.

First selector 335 can select a value of the count to output to first counter 315. First selector 335 can be an example of a variety of selector type circuit such as a multiplexer, switch, or other type of selector circuit. First selector 335's outputted count can be based upon the received high or low signal (e.g., 1 or 0 respectively) from comparator 330. For example, first selector 335 can receive the incremented count from first incrementer 325 at second input 337. First selector 335 can also receive a null (e.g., 0) value at first input 336. First selector 335 can also receive the output from comparator 330 at selector input 338. Selector input 338 can be used to determine which count value (e.g., which of first input 336 or second input 337) is output from the first selector 335 (e.g., by the output 339) and returned to the first counter 315. The count value can be 0 (e.g., from the null value input) or it can be the incremented count from first incrementer 325 (e.g., second input 337).

The selection between 0 or the incremented count can depend on the value received at selector input 338. For example, when selector input 338 (e.g., the output of comparator 330) is a low value (e.g., a 0), first selector 335 can output the incremented count from output 339 to first counter 315. This incremented count can then be used as the current count for the number of access operations performed on the memory cells within the set by first counter 315. The count value can be iteratively incremented utilizing similar steps, as described previously, until comparator 330 determines that the incremented count matches the threshold 320. In another case, when selector input 338 is a high value (e.g., a 1), first selector 335 can output a 0 value from output 339 to first counter 315. The 0 value can be used to reset the first counter 315's count for the number of access operations performed on the memory cells within the set. The resetting of first counter 315's count to 0 can signify that wear leveling operations can occur. For example, resetting the current count to 0 can signify that the count has been incremented in value from 0 to threshold 320, and wear leveling operations can be initiated. The current count (e.g., 0) can be iteratively incremented utilizing similar steps, as described previously, until the threshold is reached again (e.g., comparator 330 determines that the incremented count matches the threshold 320). In some cases, first selector 335 and second selector 340 can additional or alternatively include more inputs than the first input 336 and 341, the second input 337 and 342, and the selector input 338 and 343 respectively. For example, more inputs can be received by first selector 335 and second selector 340 from other components such as incrementors, comparators, counters, or other types of counting components.

Combined counter 305 can include second counter 345, second incrementer 350, and second selector 340. These components can be used to count the number of maintenance operations that can be performed on the memory cells in the set. In some examples, second counter 345 can count the current value of maintenance operations (e.g., the number of times maintenance operations can be performed). Second counter 345 can output the count of wear leveling operations to second incrementer 350 and second selector 340. Second incrementer 350 can increment the count of the number of wear leveling operations by a fixed number (e.g., by 1) over the current count of wear leveling operations (e.g., incremented to 2 when the number of wear leveling operations is 1). Second incrementer 350 can output the incremented wear leveling operation count to second selector 340.

Second selector 340 can select a value of the wear leveling operation count to output to second counter 345. Similar to first selector 335, second selector 340 can be a variety of selector type circuit such as a multiplexer, switch, or other type of selector circuit. Second selector 340's outputted count can be based upon the received high or low signal (e.g., 1 or 0 respectively) from comparator 330, as discussed previously. For example, second selector 340 can receive the incremented count from second incrementer 350 at second input 342. Second selector 340 can also receive the current count from second counter 345 at first input 341. Second selector 340 can also receive the output from comparator 330 at selector input 343. Selector input 343 can be used to determine which count value (e.g., which first input 341 or second input 342) is returned to second counter 345. The wear leveling operation count value can be the current count (e.g., from first input 341) or it can be the incremented count (from second input 342).

The selection between the current or the incremented count can depend on the value received at selector input 343. For example, when selector input 343 (e.g., the output of comparator 330) is a low value (e.g., a 0), second selector 340 can output the current count from output 344 to second counter 345. This count can be used as the current count for the number of wear leveling operations performed on the memory cells in the set. This count value cannot be incremented because the count has not passed through second incrementer 350. As such, in this example, the count value can remain the same count value when selector input 343 receives a low signal (e.g., a 0). In another case, when selector input 343 is a high value (e.g., a 1), second selector 340 can output the incremented count at output 344 to second counter 345. The incrementation of the current count to a higher value (e.g., a 0 to a 1 at second selector 340) can signify that wear leveling operations can occur for the memory cells in the set. In this example, second counter 345 can communicate with memory sub-system controller 310, which can include information regarding triggering wear leveling operations, and the memory sub-system controller 310 can initiate maintenance operations in the memory cells of the set, as described with reference to FIG. 2.

In some examples, the total count of the number of access operations performed on the memory cells within the set corresponding to combined counter 305 can be determined. In some cases, first counter 315 and first incrementer 325 can increment the count of access operations, as discussed previously, until comparator 330 determines that the incremented count matches the threshold 320. In some examples, when comparator 330 compares the incremented count value and threshold 320, and determines that the value satisfies threshold 320, first counter 315's count can return to 0. In this case, second selector 340 can return an incremented count of wear leveling operations to second counter 345. Second counter 345 can output the address of the set to memory sub-system controller 310, which can initiate wear leveling operations. In some examples, second counter 345 can use this incremented value of wear leveling operations to again increment when comparator 330 subsequently determines that the incremented count of access operations (e.g., first incrementer 325's output) satisfies threshold 320. However, the current count of wear leveling operations (e.g., second counter 345's count) can additionally or alternatively allow for the determination of the total count of access operations performed on the memory cells in the set. For example, first counter 315 can increment from 0 to threshold 320. Once the threshold 320 is satisfied (which can indicate the current number of access operations), second counter 345 can increment in count. The incremented count of second counter 345 can be regarded as the number of times that the count of access operations has reached the threshold 320. Thus, second counter 345's count can, in some examples, be the number of iterations of threshold 320's access operations value. In other words, the count of second counter 345 can be viewed as the wear leveling operation count multiplied by threshold 320. In this example, the overall count of combined counter 305 can be determined by adding first counter 315's count (e.g., the current number of access operations under threshold 320) to the product of second counter 345's count and threshold 320 (e.g., the number of wear leveling operations times the threshold for wear leveling operations). Thus, the overall number of access operations can be determined for combined counter 305 by utilizing first counter 315's count, second counter 345's count, and threshold 320.

Figure 4:
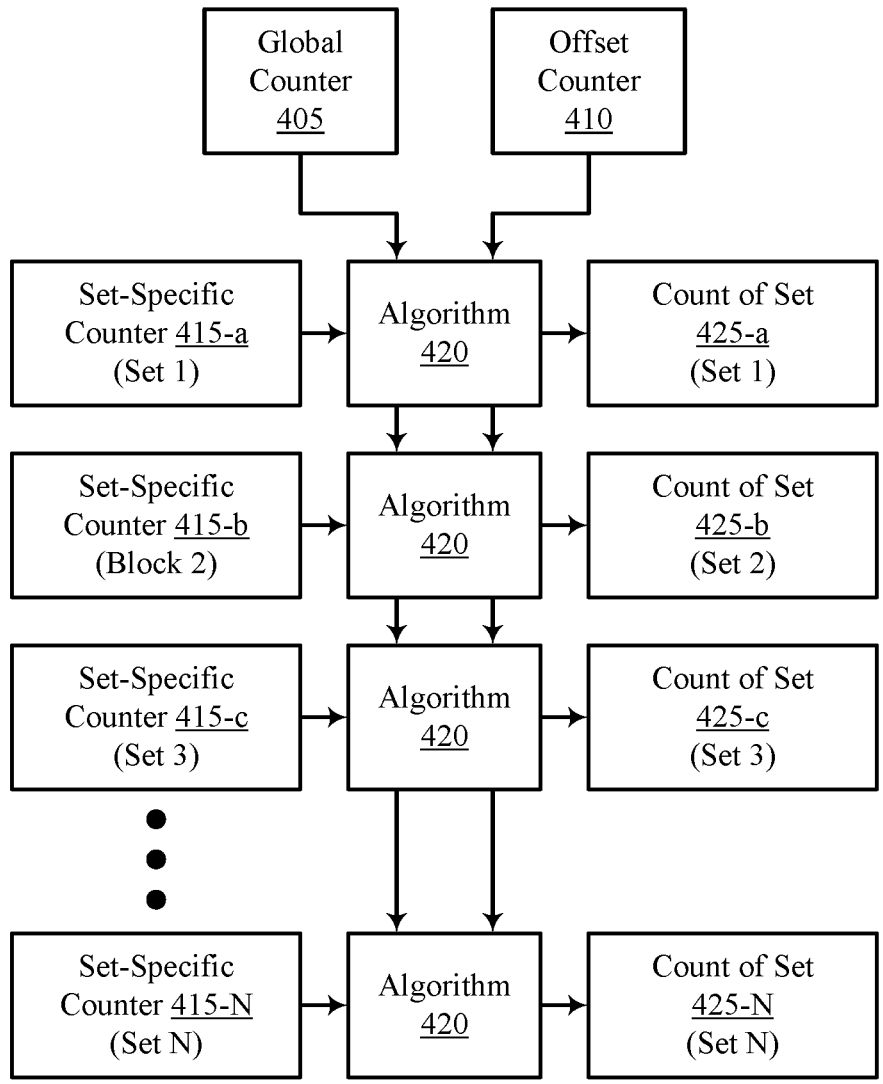
FIG. 4 illustrates an example of a counting system that supports maintenance operations for memory systems in accordance with examples as disclosed herein.

FIG. 4 illustrates an example of counting system 400 that supports maintenance operations for memory sub-systems in accordance with examples as disclosed herein. The counting system 400 can be configured to track access operations on sets of memory cells as part of performing maintenance operations, such as wear leveling operations. The counting system 400 can be implemented by a controller, software, firmware, hardware, or a combination thereof.

In some counting systems, a counting system can be used to track wear leveling operations for sets of memory cells using a global minimum counter and one or more set-specific counters tracking the differences between the global minimum value and the specific set. The global minimum counter can track the value of access operations on the set of memory with the least amount of access operations. A set-specific counter can track the differences between a set's specific count and the global minimum. Using such a type of counting system, can reduce the total number of bits used to implement the counters. For example, instead of maintaining a sixteen-bit counter for each set, the system can maintain a sixteen-bit counter for the global minimum and much small counters (e.g., two, three, four, five, six, seven, or eight bits) for the set-specific difference counters. In such systems, when the global minimum counter is updated or incremented, each of the set-specific difference counters can also be updated. Such operations can consume power and computing resources.

Aspects of the present disclosure address the above and other deficiencies by having a memory sub-system that includes a counter configured to track the access operations on sets using a global counter 405, an offset counter 410, and one or more set-specific counters 415. An algorithm 420 can use the value of the global counter 405, the offset counter 410, and each of the one or more of set-specific counters 415 to determine a count 425 of access operations performed on each set. The counting system 400 can be configured to allow the global counter 405 (e.g., the global minimum counter) to be updated without having to update each of the set-specific counters 415. There can be any number of set-specific counters (e.g., set-specific counter 415-a, set-specific counter 415-b, set-specific counter 415-c, through set-specific counter 415-N) to identify any number of counts (e.g., count 425-a, count 425-b, count 425-c, through count 425-N) for any number of sets of memory cells.

The global counter 405 can be an example of a global minimum counter. The global counter 405 can track the value of access operations on the set of memory with the least amount of access operations. A controller can identify which set has the least amount of access operations and set the global counter 405 to that value of access operations. In some cases, the global counter 405 can need to be updated as the number of access operation performed on the sets of memory cells increases.

The offset counter 410 can be configured to update the global counter 405 without affecting the set-specific counters 415. The offset counter 410 can be an example of a global counter and can be used to determine the counts 425 of one or more sets. The value of the global counter 405 and the value of the offset counter 410 can be used to determine a global least-significant value of access operations performed on the sets of memory cells. In some cases, the global least-significant value is equivalent to the value of the global minimum counter. In some implementations, the controller can update or modify the value of the offset counter 410 instead of modifying or updating the value of the global counter 405 when the global least-significant value changes. In this manner, the controller can be able to update the global least-significant value without updating the values of the set-specific counters 415, at least in some instances.

The set-specific counters 415 can be examples of counters that track at least some aspects of the differences between an actual count 425 of access operations performed on a specific set and the global counter 405. The set-specific counters 415 can be configured to cooperate with the offset counter 410 and the global counter 405 to determine the counts 425 associated with the specific sets.

The algorithm 420 can be configured to use the values of the global counter 405, the offset counter 410, and the set-specific counters 415 to determine the count 425 of access operations performed on each set. Equation 1 illustrates an example of a procedure that can be used as part of the algorithm 420.

$$\text{Count} = \alpha + ((\beta - \gamma) \mod(\delta)) \quad (1)$$

In Equation 1, the term $\alpha$ can refer to the value of the global counter 405; the term $\beta$ can refer to the value of a set-specific counter 415; the term $\gamma$ can refer to the value of the offset counter 410; and the term $\delta$ can refer to a modifier value.

A controller implementing the algorithm 420 to determine counts 425 of access operations on sets, can be configured to identify a value of the global counter 405. The value of the global counter 405 can indicate a baseline quantity of access operations performed on the sets of memory cells. The controller can determine a difference between a value of a set-specific counter 415-a and a value of the offset counter 410 as part of determining the count 425-a associated with the specific set of memory cells. The set-specific counter 415-a can be associated with a first set of the sets of memory cells. The offset counter 410 can be for indicating a global offset value relative to the value of the global counter 405.

The controller implementing the algorithm 420 can be configured to identify a remainder using a modulo operation. For example, the controller can apply a modulo operation using the difference between the value of the set-specific counter 415-a and the value of the offset counter 410 and a modifier value or parameter. The modifier value can be any value. In some cases, the modifier value can be related to an upper-limit of a difference between the value of the global counter 405 and a value of a set-specific counter 415 that the counting system will tolerate. In some cases, the modifier value can be related to a number of bits associated with the value of the set-specific counters 415.

The controller implementing the algorithm 420 can be configured to add the value of the global counter 405 to the remainder determined earlier. The sum of the value of the global counter 405 and the remainder can be a count 425-a (e.g., a quantity) of access operations performed on the specific set.

The controller can use the counts 425 to determine whether to perform a maintenance operation (such as a wear leveling operation). The controller can compare the count 425 with a threshold (as described with reference to FIGS. 2 and 3) and can initiate a maintenance operation based on that comparison.

Figure 5:
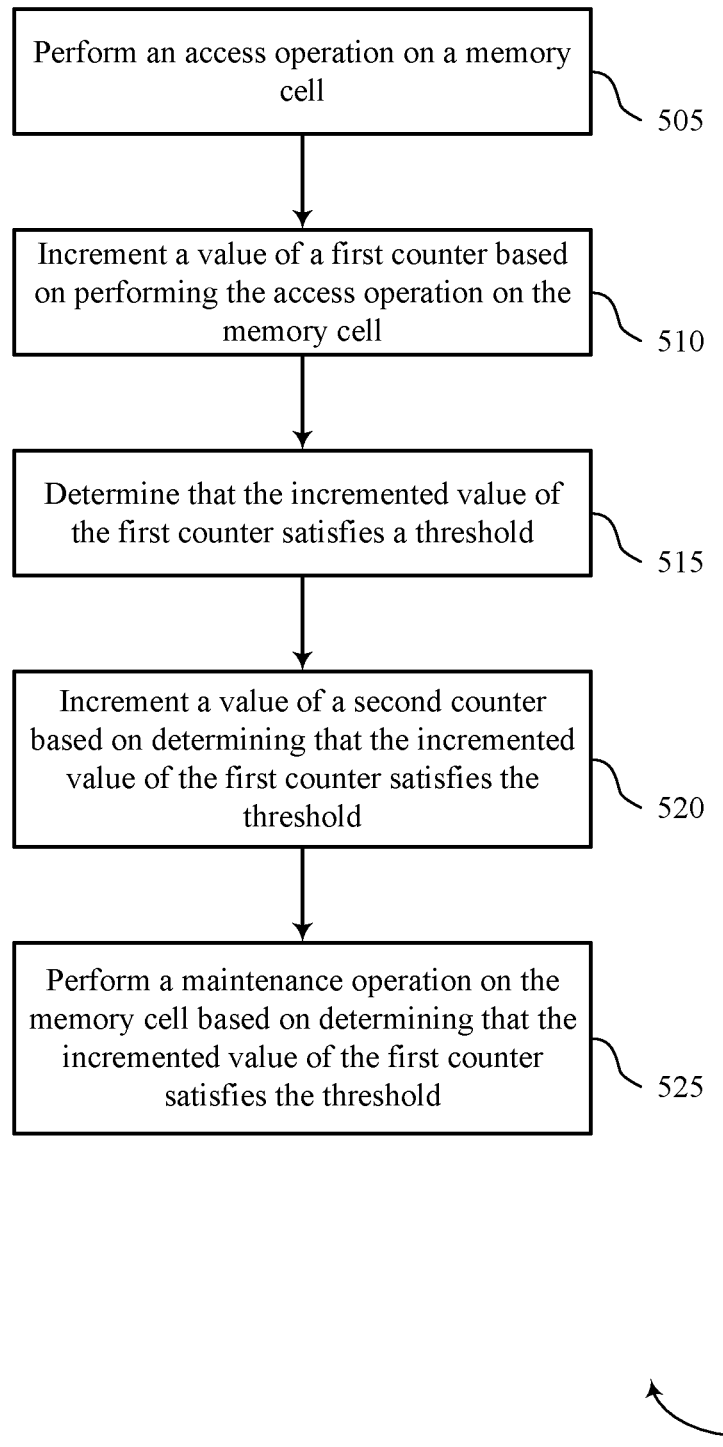
FIGS. 5 through 8 show flowcharts illustrating a method or methods that support maintenance operations for memory systems in accordance with examples as disclosed herein.

FIG. 5 shows a flowchart illustrating a method or methods 500 that supports maintenance operations for memory sub-systems in accordance with aspects of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 can be performed by counter 150 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other methods are possible.

At 505, the processing device can perform an access operation on a memory cell.

At 510, the processing device can increment a value of a first counter based on performing the access operation on the memory cell.

At 515, the processing device can determine that the incremented value of the first counter satisfies a threshold.

At 520, the processing device can increment a value of a second counter based on determining that the incremented value of the first counter satisfies the threshold.

At 525, the processing device can perform a maintenance operation on the memory cell based on determining that the incremented value of the first counter satisfies the threshold.

In some examples, an apparatus as described herein can perform a method or methods, such as the method 500. The apparatus may include a controller that is operable to cause the apparatus to perform the methods described herein. For example, the controller may cause the apparatus to perform an access operation on a memory cell, increment a value of a first counter based on performing the access operation on the memory cell, determine that the incremented value of the first counter satisfies a threshold, increment a value of a second counter based on determining that the incremented value of the first counter satisfies the threshold, and perform a maintenance operation on the memory cell based on determining that the incremented value of the first counter satisfies the threshold.

In other examples, the apparatus can include features, means, or instructions (e.g., a non-transitory computer-readable medium storing instructions executable by a processor) for performing the features of the methods described herein.

Figure 6:
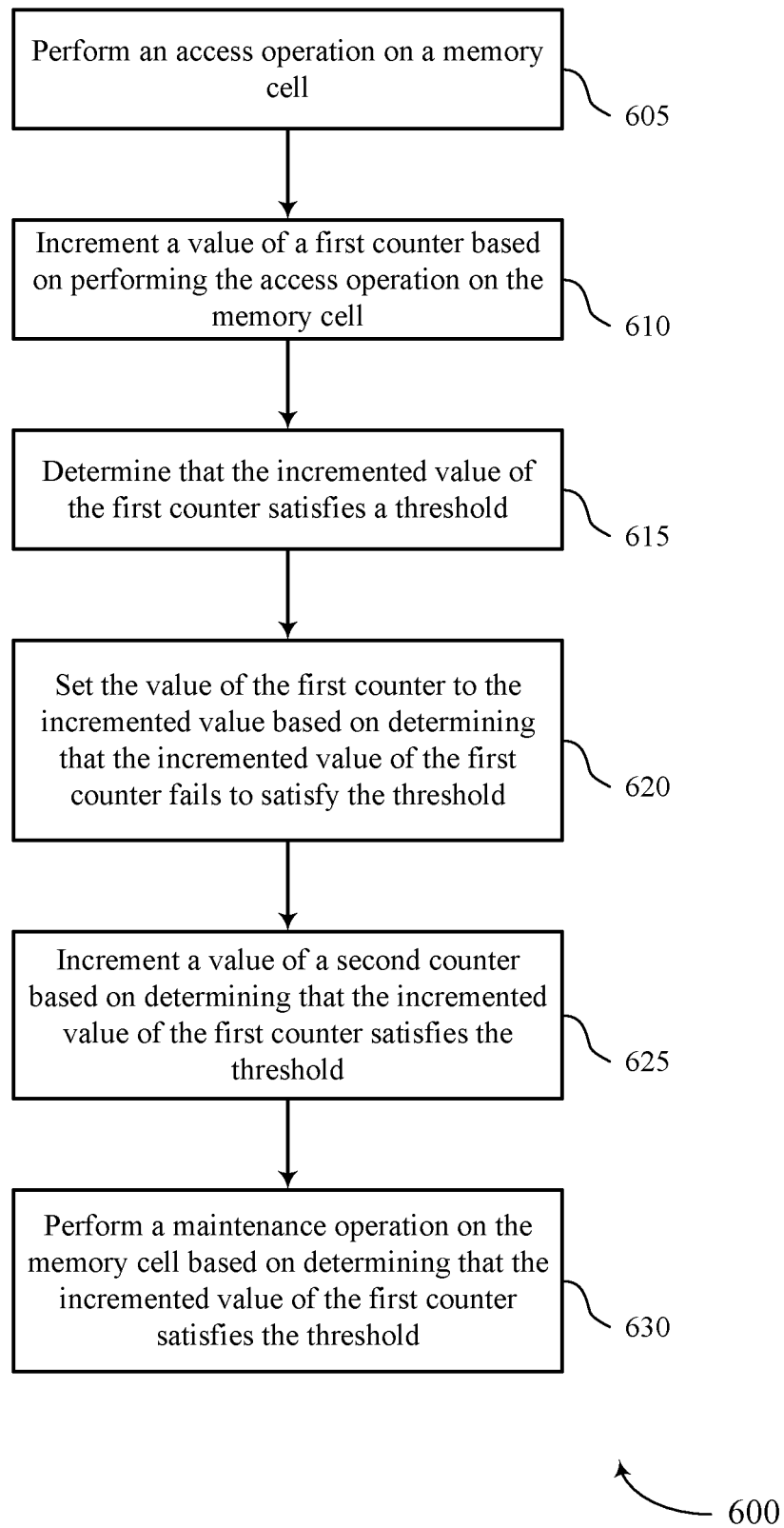

FIG. 6 shows a flowchart illustrating a method or methods 600 that supports maintenance operations for memory subsystems in accordance with aspects of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 can be performed by counter 150 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other methods are possible.

At 605, the processing device can perform an access operation on a memory cell.

At 610, the processing device can increment a value of a first counter based on performing the access operation on the memory cell.

At 615, the processing device can determine that the incremented value of the first counter satisfies a threshold.

At 620, the processing device can set the value of the first counter to the incremented value based on determining that the incremented value of the first counter fails to satisfy the threshold.

At 625, the processing device can increment a value of a second counter based on determining that the incremented value of the first counter satisfies the threshold.

At 630, the processing device can perform a maintenance operation on the memory cell based on determining that the incremented value of the first counter satisfies the threshold.

Figure 7:
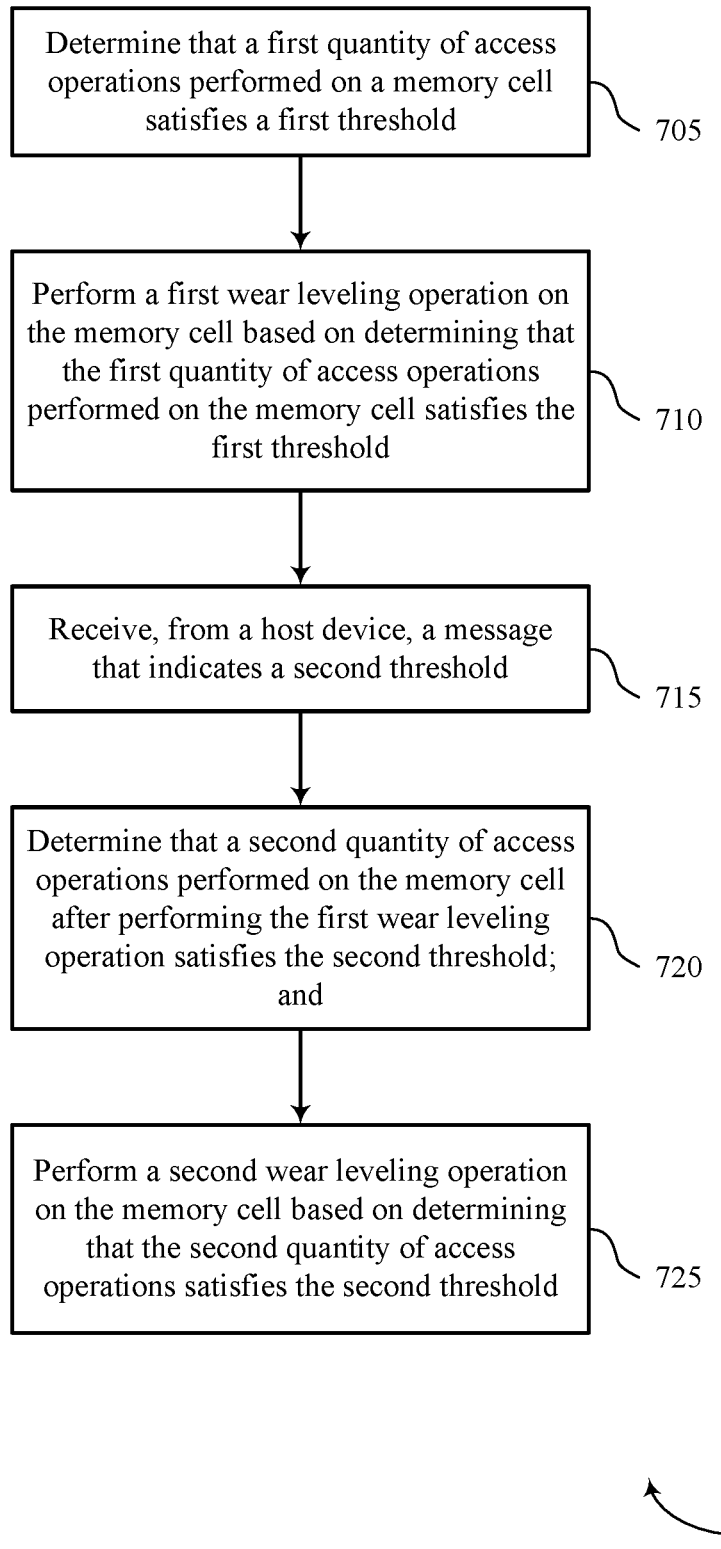

FIG. 7 shows a flowchart illustrating a method or methods 700 that supports maintenance operations for memory subsystems in accordance with aspects of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 can be performed by counter 150 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other methods are possible.

At 705, the processing device can determine that a first quantity of access operations performed on a memory cell satisfies a first threshold.

At 710, the processing device can perform a first wear leveling operation on the memory cell based on determining that the first quantity of access operations performed on the memory cell satisfies the first threshold.

At 715, the processing device determine a second threshold.

At 720, the processing device can determine that a second quantity of access operations performed on the memory cell after performing the first wear leveling operation satisfies the second threshold.

At 725, the processing device can perform a second wear leveling operation on the memory cell based on determining that the second quantity of access operations satisfies the second threshold.

The apparatus may include a controller that is operable to cause the apparatus to perform the methods described herein. For example, the controller may cause the apparatus to determine that a first quantity of access operations performed on a memory cell satisfies a first threshold, perform a first wear leveling operation on the memory cell based on determining that the first quantity of access operations performed on the memory cell satisfies the first threshold, determine a second threshold, determine that a second quantity of access operations performed on the memory cell after performing the first wear leveling operation satisfies the second threshold, and perform a second wear leveling operation on the memory cell based on determining that the second quantity of access operations satisfies the second threshold.

In other examples, the apparatus can include features, means, or instructions (e.g., a non-transitory computer-readable medium storing instructions executable by a processor) for performing the features of the methods described herein.

Figure 8:
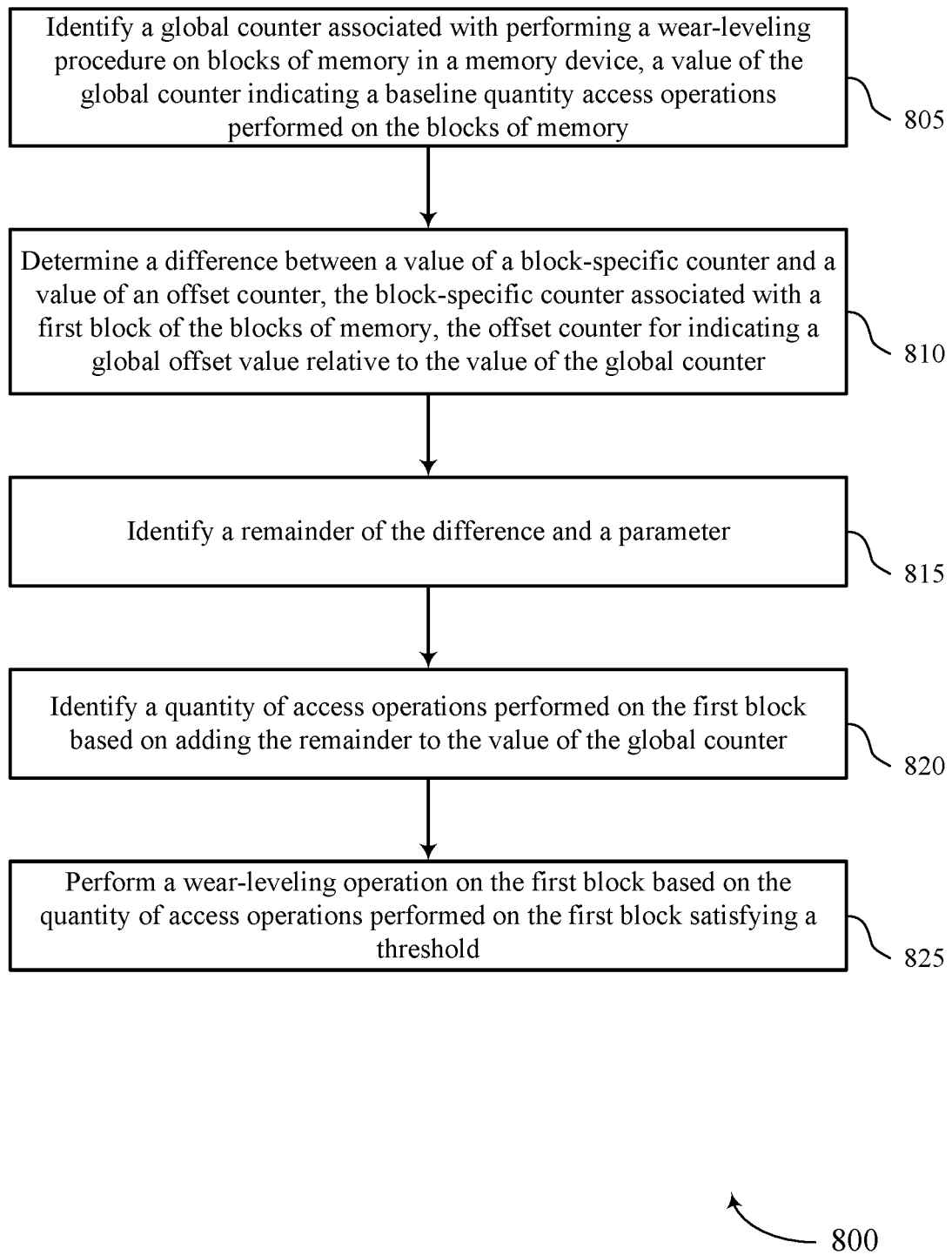
Figure 9:
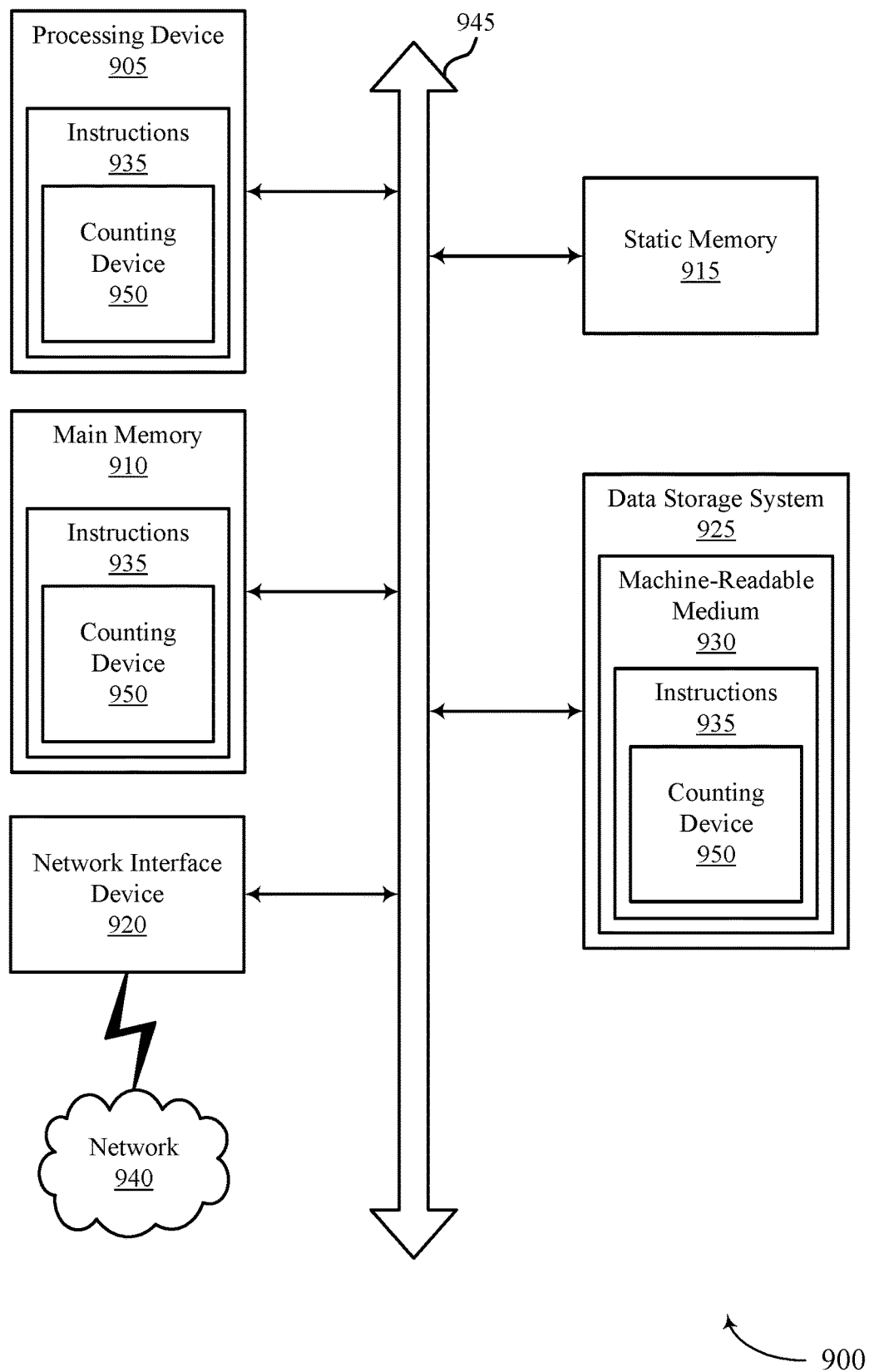
FIG. 9 illustrates an example machine of a computer system that supports maintenance operations for memory systems in accordance with examples as disclosed herein.

FIG. 8 shows a flowchart illustrating a method or methods 800 that supports maintenance operations for memory subsystems in accordance with aspects of the present disclosure. The operations of method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 can be performed by counter 150 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other methods are possible.

At 805, the processing device can identify a global counter associated with performing a wear-leveling procedure on sets of memory cells, a value of the global counter indicating a baseline quantity of access operations performed on the sets of memory cells.

At 810, the processing device can determine a difference between a value of a set-specific counter and a value of an offset counter, the set-specific counter associated with a first set of the sets of memory cells, the offset counter for indicating a global offset value relative to the value of the global counter.

At 815, the processing device can identify a remainder of the difference and a parameter.

At 820, the processing device can identify a quantity of access operations performed on the first set based on adding the remainder to the value of the global counter.

At 825, the processing device can perform a wear-leveling operation on the first set based on the quantity of access operations performed on the first set satisfying a threshold.

The apparatus may include a controller that is operable to cause the apparatus to perform the methods described herein. For example, the controller may cause the apparatus to identify a global counter associated with performing a wear-leveling procedure on sets of memory cells in a memory device, a value of the global counter indicating a baseline quantity of access operations performed on the sets of memory cells, determine a difference between a value of a set-specific counter and a value of an offset counter, the set-specific counter associated with a first set of the sets of memory cells, the offset counter for indicating a global offset value relative to the value of the global counter, identify a remainder of the difference and a parameter, identify a quantity of access operations performed on the first set based on adding the remainder to the value of the global counter, and perform a wear-leveling operation on the first set based on the quantity of access operations performed on the first set satisfying a threshold.

In other examples, the apparatus can include features, means, or instructions (e.g., a non-transitory computer-readable medium storing instructions executable by a processor) for performing the features of the methods described herein.

FIG. 10 illustrates an example machine of a computer system 900 that supports a maintenance operations for memory sub-systems in accordance with examples as disclosed herein. The computer system 900 can include a set of instructions, for causing the machine to perform any one or more of the techniques described herein. In some examples, the computer system 900 can correspond to a host system (e.g., the host system 105 described with reference to FIG. 1) that includes, is coupled with, or utilizes a memory sub-system (e.g., the memory sub-system 110 described with reference to FIG. 1) or can be used to perform the operations of a controller (e.g., to execute an operating system to perform operations corresponding to the counter 150 described with reference to FIG. 1). In some examples, the machine can be connected (e.g., networked) with other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" can also include any collection of machines that individually or jointly execute a set (or multiple sets) of instructions to perform any one or more of the methodologies discussed herein.

The example computer system 900 can include a processing device 905, a main memory 910 (e.g., read-only memory (ROM), flash memory, DRAM such as synchronous DRAM (SDRAM) or RDRAM, etc.), a static memory 915 (e.g., flash memory, static random access memory (SRAM), etc.), and a data storage system 925, which communicate with each other via a bus 945.

Processing device 905 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 905 can also be one or more special-purpose processing devices such as an application specific integrated circuit (ASIC), a field programmable gate array (FPGA), a digital signal processor (DSP), network processor, or the like. The processing device 905 is configured to execute instructions 935 for performing the operations and steps discussed herein. The computer system 900 can further include a network interface device 920 to communicate over the network 940.

The data storage system 925 can include a machine-readable storage medium 930 (also known as a computer-readable medium) on which is stored one or more sets of instructions 935 or software embodying any one or more of the methodologies or functions described herein. The instructions 935 can also reside, completely or at least partially, within the main memory 910 and/or within the processing device 905 during execution thereof by the computer system 900, the main memory 910 and the processing device 905 also constituting machine-readable storage media. The machine-readable storage medium 930, data storage system 925, and/or main memory 910 can correspond to a memory sub-system.

In one example, the instructions 935 include instructions to implement functionality corresponding to a counting device 950 (e.g., the counting device 950 described with reference to FIG. 1). While the machine-readable storage medium 930 is shown as a single medium, the term "machine-readable storage medium" can include a single medium or multiple media that store the one or more sets of instructions. The term "machine-readable storage medium" can also include any medium that is capable of storing or encoding a set of instructions for execution by the machine and that cause the machine to perform any one or more of the methodologies of the present disclosure. The term "machine-readable storage medium" can include, but not be limited to, solid-state memories, optical media, and magnetic media.

Information and signals described herein can be represented using any of a variety of different technologies and techniques. For example, data, instructions, commands, information, signals, bits, symbols, and chips that can be referenced throughout the above description can be represented by voltages, currents, electromagnetic waves, magnetic fields or particles, optical fields or particles, or any combination thereof. Some drawings can illustrate signals as a single signal; however, it will be understood by a person of ordinary skill in the art that the signal can represent a bus of signals, where the bus can have a variety of bit widths.

As used herein, the term "virtual ground" refers to a node of an electrical circuit that is held at a voltage of approximately zero volts (0V) but that is not directly coupled with ground. Accordingly, the voltage of a virtual ground can temporarily fluctuate and return to approximately 0V at steady state. A virtual ground can be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" can refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) can be an open circuit or a closed circuit based on the operation of the device that includes the connected components. The conductive path between connected components can be a direct conductive path between the components or the conductive path between connected components can be an indirect conductive path that can include intermediate components, such as switches, transistors, or other components. In some cases, the flow of signals between the connected components can be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "electrode" can refer to an electrical conductor, and in some cases, can be employed as an electrical contact to a memory cell or other component of a memory array. An electrode can include a trace, wire, conductive line, conductive layer, or the like that provides a conductive path between elements or components of memory array.

The devices discussed herein, including a memory array, can be formed on a semiconductor substrate, such as silicon, germanium, silicon-germanium alloy, gallium arsenide, gallium nitride, etc. In some cases, the substrate is a semiconductor wafer. In other cases, the substrate can be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, can be controlled through doping using various chemical species including, but not limited to, phosphorous, boron, or arsenic. Doping can be performed during the initial formation or growth of the substrate, by ion-implantation, or by any other doping means.

A switching component or a transistor discussed herein can represent a field-effect transistor (FET) and comprise a three terminal device including a source, drain, and gate. The terminals can be connected to other electronic elements through conductive materials, e.g., metals. The source and drain can be conductive and can comprise a heavily-doped, e.g., degenerate, semiconductor region. The source and drain can be separated by a lightly-doped semiconductor region or channel. If the channel is n-type (i.e., majority carriers are signals), then the FET can be referred to as a n-type FET. If the channel is p-type (i.e., majority carriers are holes), then the FET can be referred to as a p-type FET. The channel can be capped by an insulating gate oxide. The channel conductivity can be controlled by applying a voltage to the gate. For example, applying a positive voltage or negative voltage to an n-type FET or a p-type FET, respectively, can result in the channel becoming conductive. A transistor can be "on" or "activated" when a voltage greater than or equal to the transistor's threshold voltage is applied to the transistor gate. The transistor can be "off" or "deactivated" when a voltage less than the transistor's threshold voltage is applied to the transistor gate.

The description set forth herein, in connection with the appended drawings, describes example configurations and does not represent all the examples that can be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, can be practiced without these specific details. In some instances, well-known structures and devices are shown in block diagram form to avoid obscuring the concepts of the described examples.

In the appended figures, similar components or features can have the same reference label. Further, various components of the same type can be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein can be implemented or performed with a general-purpose processor, a DSP, an ASIC, an FPGA or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices (e.g., a combination of a DSP and a microprocessor, multiple microprocessors, one or more microprocessors in conjunction with a DSP core, or any other such configuration).

The functions described herein can be implemented in hardware, software executed by a processor, firmware, or any combination thereof. If implemented in software executed by a processor, the functions can be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions can also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" can be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium can be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein can be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
    a memory sub-system controller configured to receive access commands and wear-leveling operation commands from a host device;
    a first counter coupled with the memory sub-system controller and configured to count a quantity of the access commands received by the memory sub-system controller;
    a comparator circuit coupled with the first counter and configured to compare an incremented value of the first counter with a threshold;
    a first selector circuit coupled with the comparator circuit, wherein the first selector circuit comprises a second data input and a selection input, and wherein:
        the second data input is configured to receive a baseline value associated with the first counter, and
        the selection input is configured to receive a value indicating whether the incremented value of the first counter satisfies the threshold; and
    a second counter coupled with the memory sub-system controller and the first counter, wherein the second counter is configured to count a quantity of the wear-leveling operation commands.

2. The apparatus of claim 1, wherein the first selector circuit further comprises a multiplexer and a first data input.

3. The apparatus of claim 2, wherein the first selector circuit is configured to determine an incremented counter value of the first counter based at least in part on one or more outputs of the comparator circuit.

4. The apparatus of claim 2, wherein:
    the first data input is configured to receive an incremented value of the first counter, wherein the value is a Boolean value.

5. The apparatus of claim 1, wherein a second selector circuit is configured to determine an incremented counter value of the second counter based at least in part on one or more outputs of a comparator circuit.

6. An apparatus, comprising:
    a first counter;
    a second counter coupled with the first counter;
    a third counter associated with performing a wear-leveling operation on sets of memory cells in a memory device;
    a fourth counter associated with a first set of the sets of memory cells; and
    a fifth counter for indicating a global offset value relative to a value of the third counter;
    a second incrementor coupled with the second counter and configured to increment a value of a quantity of wear-leveling operations;

a comparator coupled with the first counter and configured to compare a value of the first counter with a threshold; and one or more selection circuits coupled with the comparator and configured to determine incremented counter values of the first counter and the second counter based at least in part on one or more outputs of the comparator.

7. The apparatus of claim 6, further comprising:
a first incrementor coupled with the first counter and configured to increment a value of a quantity of access operations based at least in part on a quantity of access commands received by the first counter.

8. The apparatus of claim 6, wherein the one or more selection circuits comprises a first selection circuit, and wherein the first selection circuit is configured to set the value of the first counter based at least in part on determining an incremented value of the first counter satisfies the threshold.

9. The apparatus of claim 6, wherein the one or more selection circuits comprises a second selection circuit, and wherein the second selection circuit is configured to set a value of the second counter based at least in part on determining whether an incremented value of the first counter satisfies the threshold.

10. An apparatus, comprising:
a first counter;
a second counter;
a second incrementor coupled with the second counter, wherein the second counter is configured to output a count of wear-leveling operations to the second incrementor;
a second selector circuit coupled with the second counter, wherein the second selector circuit comprises a second data input and a selection input, and wherein:
the second data input is configured to receive a count of the second counter, and
the selection input is configured to receive a value indicating whether an incremented count of the first counter satisfies a threshold; and
a controller coupled with the first counter and the second counter and operable to cause the apparatus to:
track access operations performed on a memory cell;
increment a count of the first counter and a count of the second counter based at least in part on tracking the access operations performed on the memory cell; and
determine whether to perform wear-leveling operations on the memory cell based at least in part on incrementing a count of the first counter and count of the second counter.

11. The apparatus of claim 10, further comprising:
a first incrementor coupled with the first counter.

12. The apparatus of claim 11, wherein the first counter is configured to output a current access operation count to the first incrementor.

13. The apparatus of claim 11, further comprising:
a first selector circuit coupled with the first incrementor; and
a comparator coupled with the first incrementor and the first selector circuit, wherein the first incrementor is configured to output an incremented access operation count to the comparator and the first selector circuit.

14. The apparatus of claim 13, further comprising:
a second selector circuit coupled with the second incrementor and the comparator, wherein the second incrementor is configured to output an incremented wear-leveling operation count to the second selector circuit.

* * * * *